United States Patent
Her et al.

(10) Patent No.: US 11,276,561 B2
(45) Date of Patent: Mar. 15, 2022

(54) PLASMA ETCHING METHOD USING FARADAY CAGE

(71) Applicant: LG CHEM, LTD., Seoul (KR)

(72) Inventors: Eun Kyu Her, Daejeon (KR); Chung Wan Kim, Daejeon (KR); Song Ho Jang, Daejeon (KR); Bu Gon Shin, Daejeon (KR); Jeong Ho Park, Daejeon (KR); Jung Hwan Yoon, Daejeon (KR); So Young Choo, Daejeon (KR)

(73) Assignee: LG CHEM, LTD., Seoul (KR)

( * ) Notice: Subject to any disclaimer, the term of this patent is extended or adjusted under 35 U.S.C. 154(b) by 94 days.

(21) Appl. No.: 16/641,878

(22) PCT Filed: Oct. 19, 2018

(86) PCT No.: PCT/KR2018/012373
§ 371 (c)(1),
(2) Date: Feb. 25, 2020

(87) PCT Pub. No.: WO2019/078657
PCT Pub. Date: Apr. 25, 2019

(65) Prior Publication Data
US 2020/0203131 A1 Jun. 25, 2020

(30) Foreign Application Priority Data
Oct. 20, 2017 (KR) .................. 10-2017-0136547

(51) Int. Cl.
*H01L 21/3065* (2006.01)
*H01J 37/32* (2006.01)
(Continued)

(52) U.S. Cl.
CPC ........ *H01J 37/32467* (2013.01); *C03C 15/00* (2013.01); *G02B 6/0018* (2013.01);
(Continued)

(58) Field of Classification Search
CPC .................................................. H01L 21/3065
See application file for complete search history.

(56) References Cited

U.S. PATENT DOCUMENTS 4,564,812 A * 1/1986 Van Dijk ............... G01R 33/28
324/309
6,097,157 A * 8/2000 Overzet ................... H05H 1/46
118/723 I (Continued)

FOREIGN PATENT DOCUMENTS

JP 4131813 B2 8/2008
JP 2012-23242 A 2/2012

(Continued)

OTHER PUBLICATIONS

Boyd, G. D. et al., "Directional reactive ion etching at oblique angles", Applied Physics Letters, vol. 36, No. 7, pp. 583-585 (Apr. 1980).

*Primary Examiner* — Thomas T Pham
(74) *Attorney, Agent, or Firm* — Dentons US LLP

(57) ABSTRACT

A plasma etching method using a Faraday cage, comprising: providing a Faraday cage having a mesh portion on an upper surface thereof in a plasma etching apparatus; providing a quartz substrate having a metal mask with an opening provided on one surface of the metal mask in the Faraday cage; and patterning the quartz substrate with plasma etching.

16 Claims, 27 Drawing Sheets

(51) Int. Cl.
  *C03C 15/00* (2006.01)
  *F21V 8/00* (2006.01)
(52) U.S. Cl.
  CPC ......... *G02B 6/0038* (2013.01); *G02B 6/0065* (2013.01); *H01J 2237/334* (2013.01)

(56) References Cited

U.S. PATENT DOCUMENTS

| | | | |
|---|---|---|---|
| 6,960,413 B2 * | 11/2005 | Brooks | C23F 4/00 |
| | | | 216/67 |
| 7,879,510 B2 | 2/2011 | Anderson et al. | |
| 9,659,797 B1 | 5/2017 | Burckel et al. | |
| 2012/0009512 A1 * | 1/2012 | Jang | B82Y 40/00 |
| | | | 430/5 |
| 2013/0337370 A1 * | 12/2013 | Lee | G03F 1/38 |
| | | | 430/5 |
| 2014/0367687 A1 * | 12/2014 | Loncar | H01L 21/3065 |
| | | | 257/52 |
| 2015/0037597 A1 | 2/2015 | Kim et al. | |
| 2016/0211156 A1 | 7/2016 | Singh et al. | |

FOREIGN PATENT DOCUMENTS

| | | |
|---|---|---|
| JP | 5566970 B2 | 8/2014 |
| KR | 10-0281241 B1 | 6/2001 |
| KR | 10-0451291 B1 | 1/2005 |
| KR | 10-2007-0018585 A | 1/2008 |
| KR | 10-0849396 B1 | 7/2008 |
| KR | 10-1252062 B1 | 4/2013 |
| KR | 10-1409387 B1 | 6/2014 |
| WO | 2013/147966 A2 | 10/2013 |

\* cited by examiner

[Figure 1]
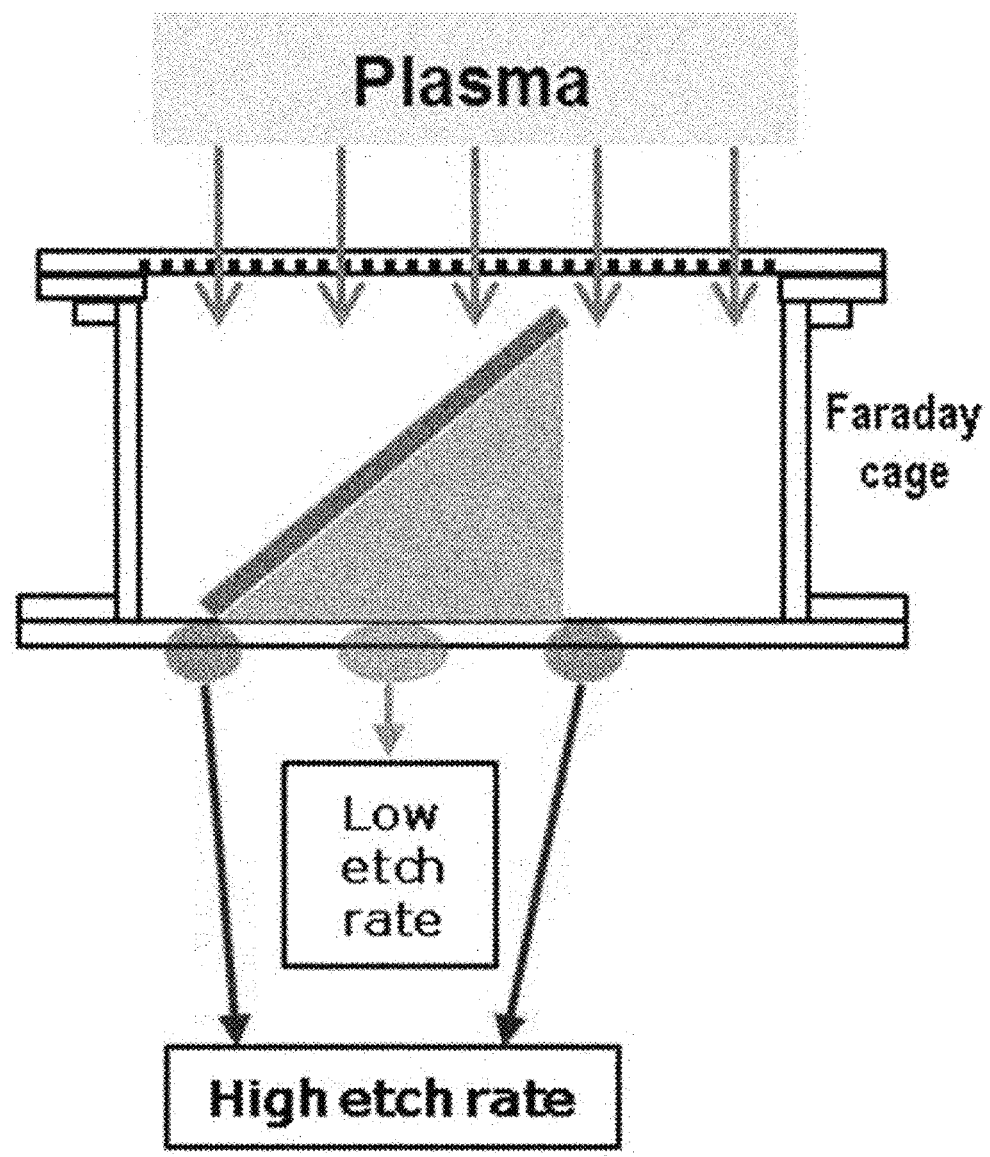

[Figure 2]
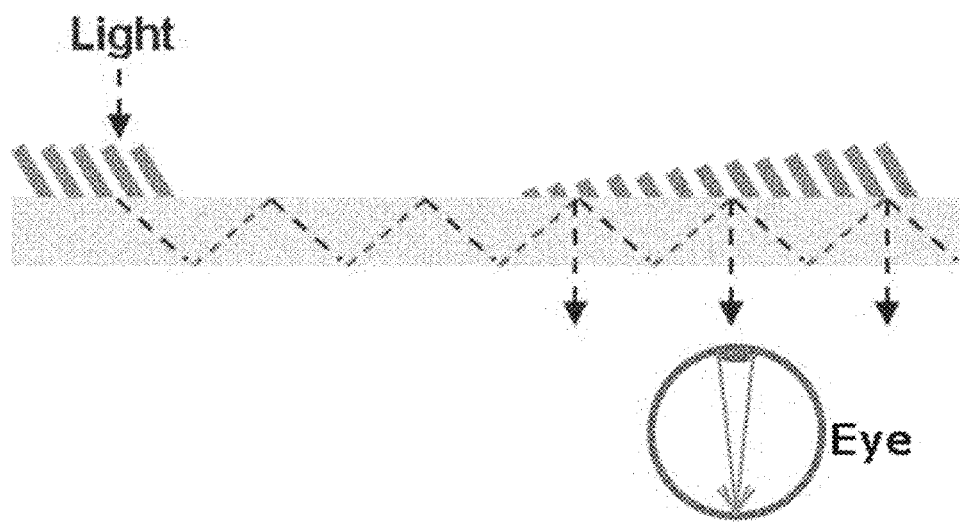

[Figure 3]
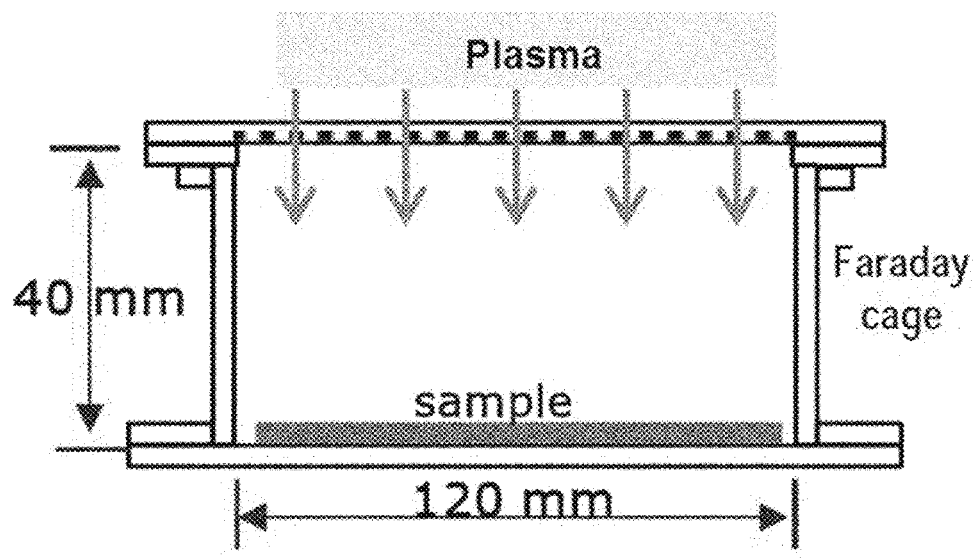

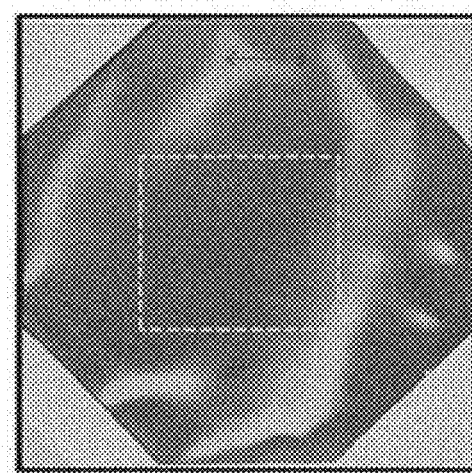
[Figure 4A]
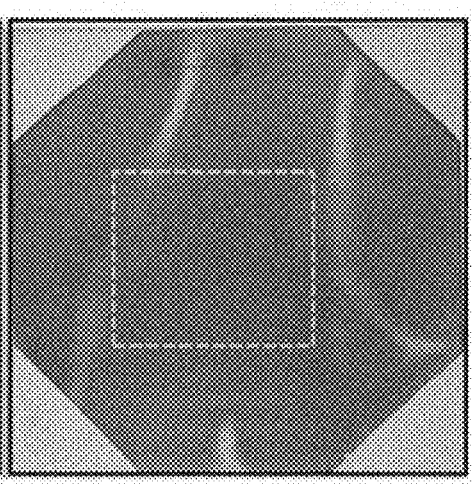
[Figure 4B]

[Figure 5]
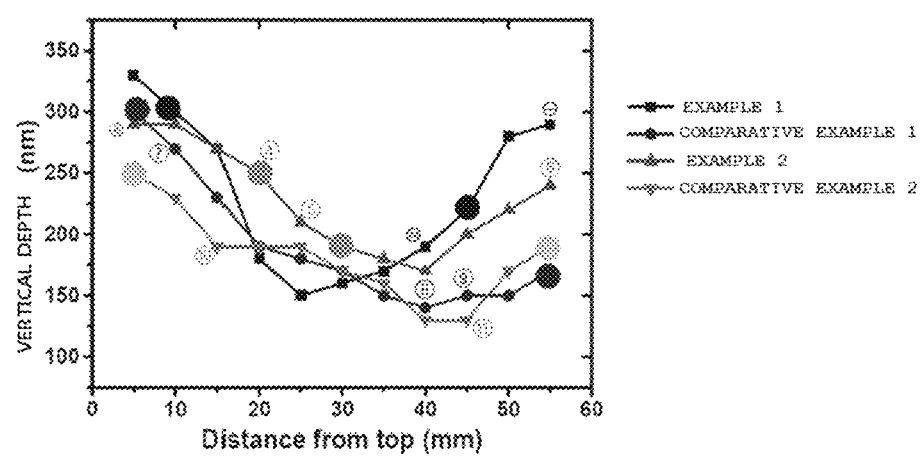

[Figure 6A]
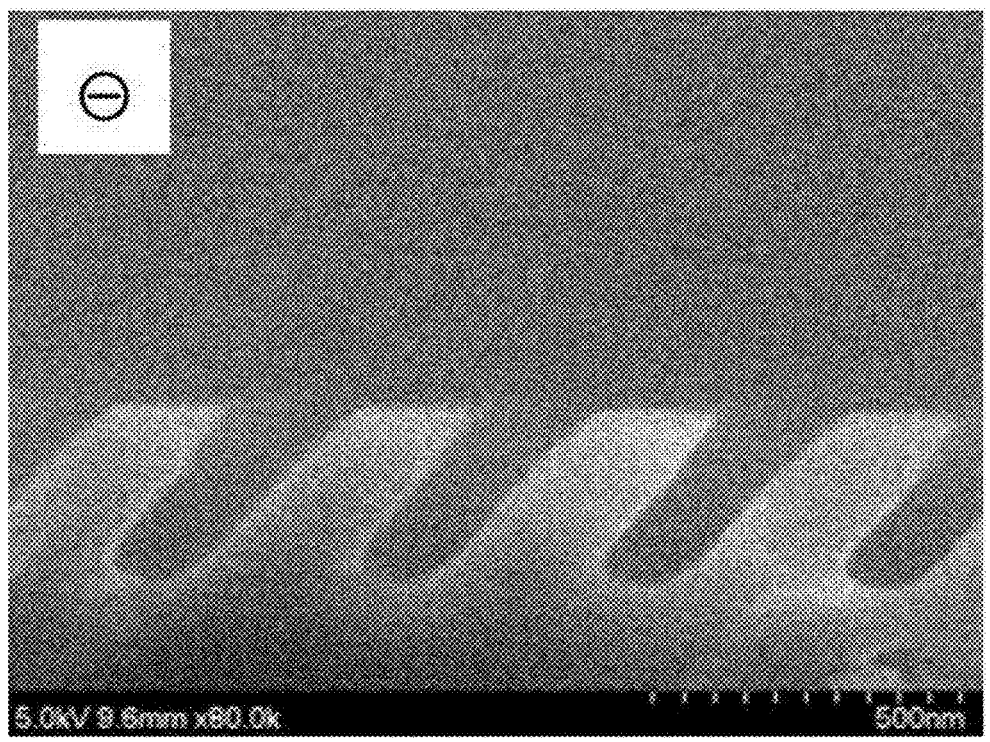

[Figure 6B]
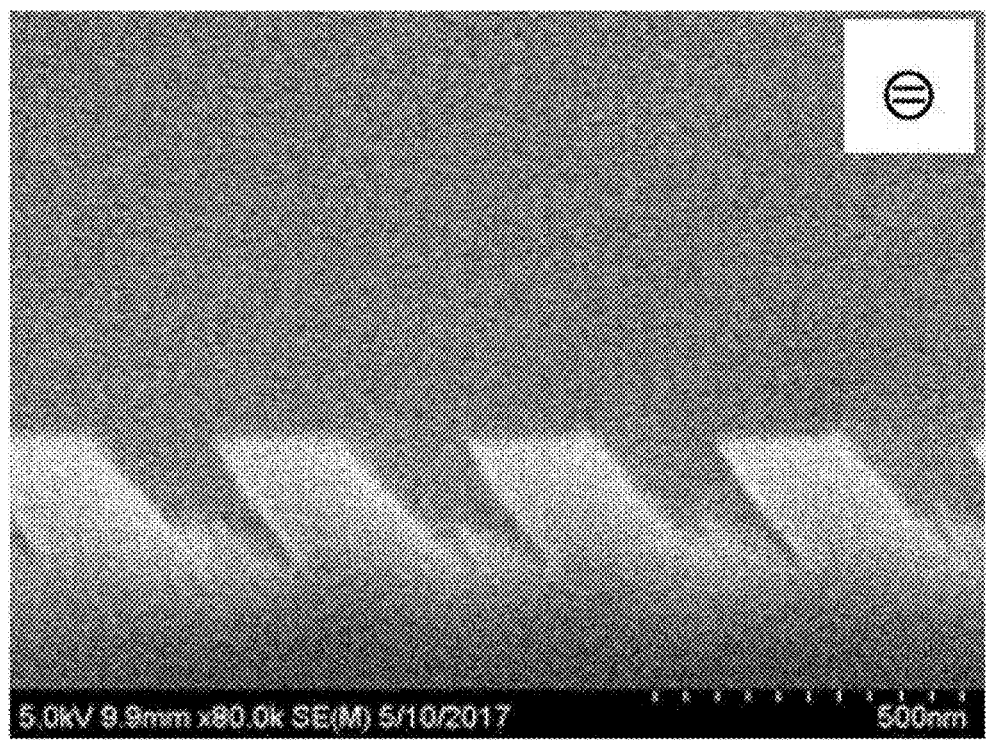

[Figure 7A]
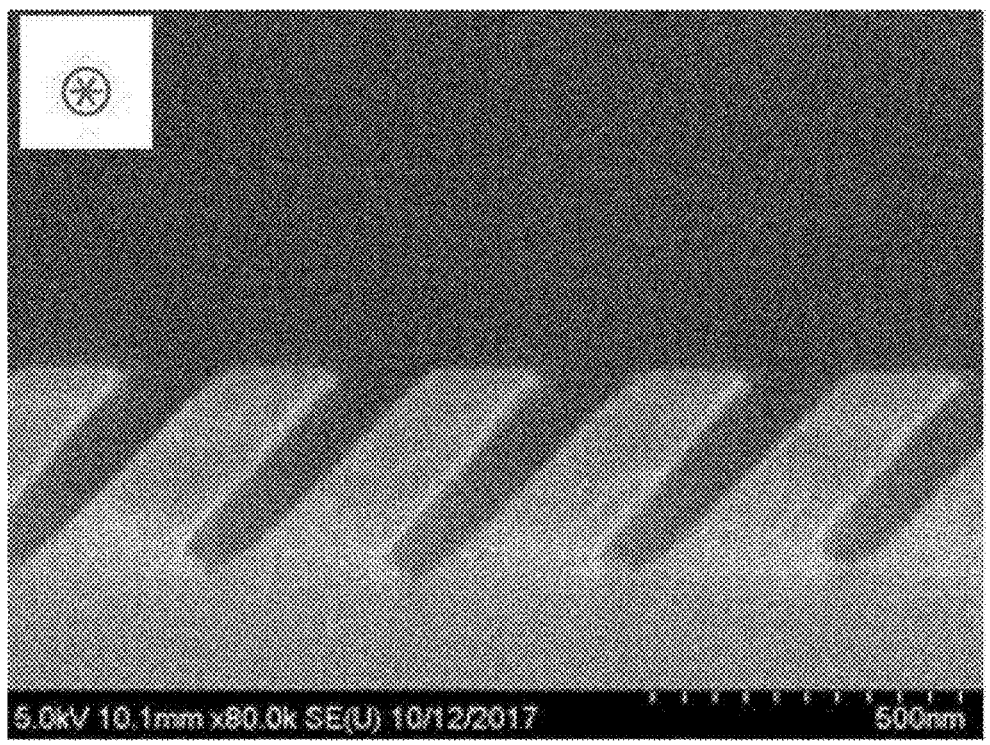

[Figure 7B]
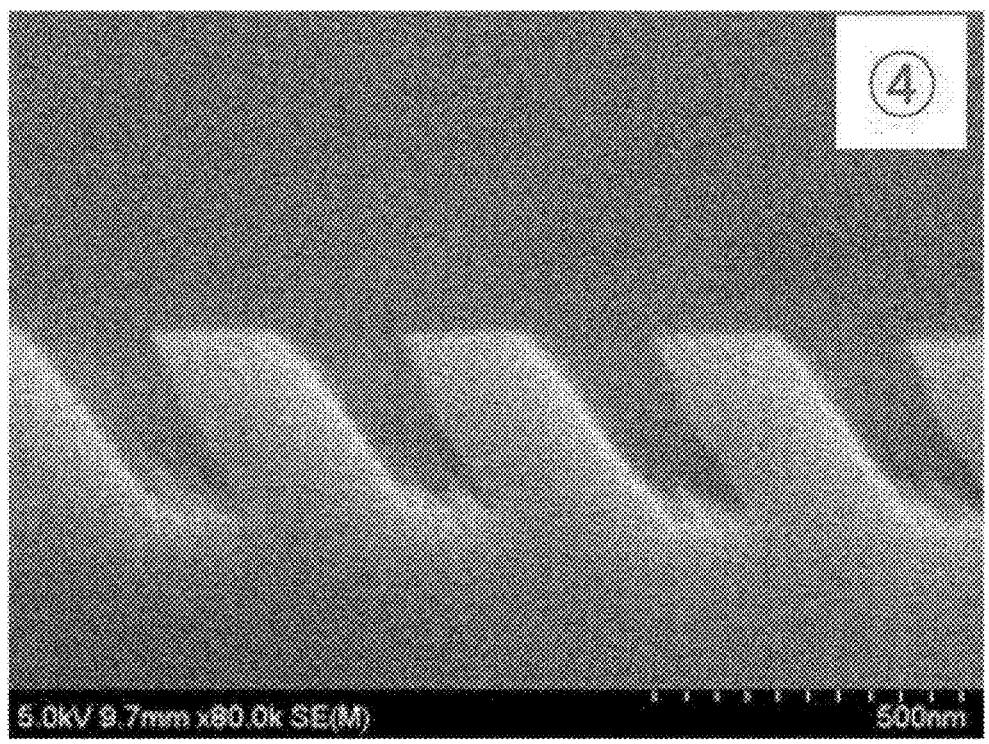

[Figure 7C]
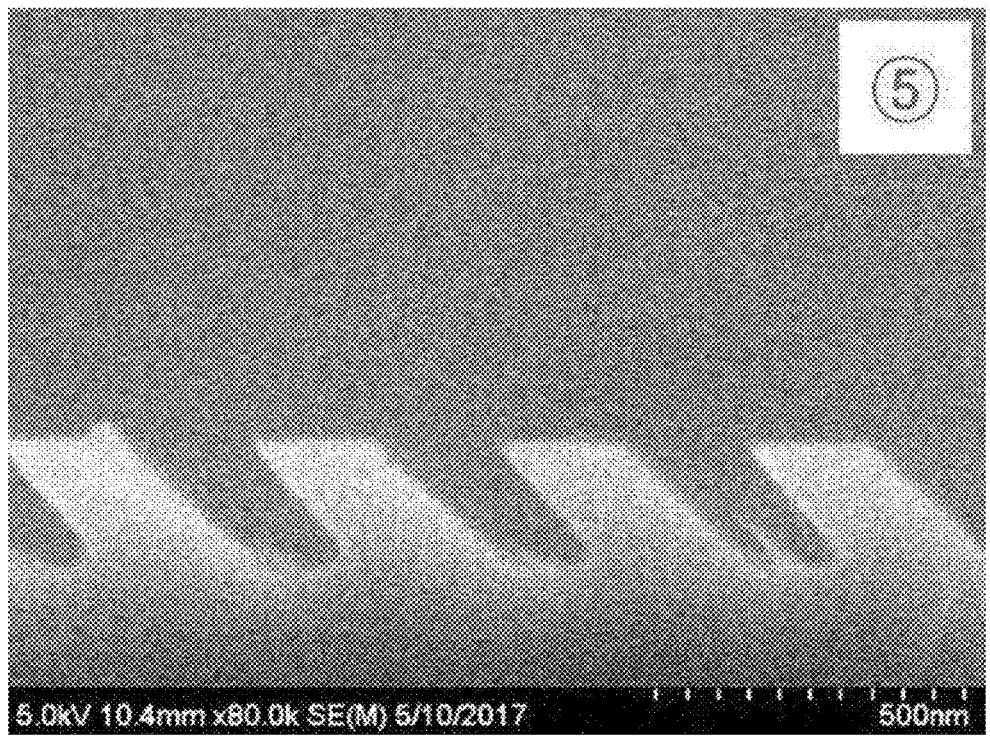

[Figure 7D]
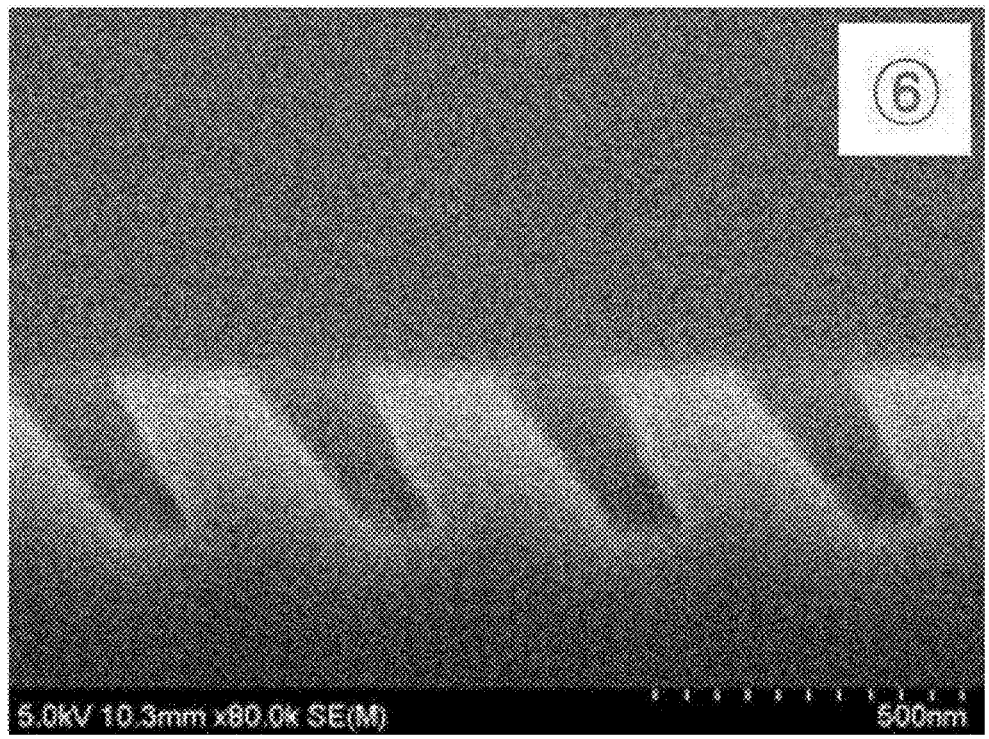

[Figure 8A]
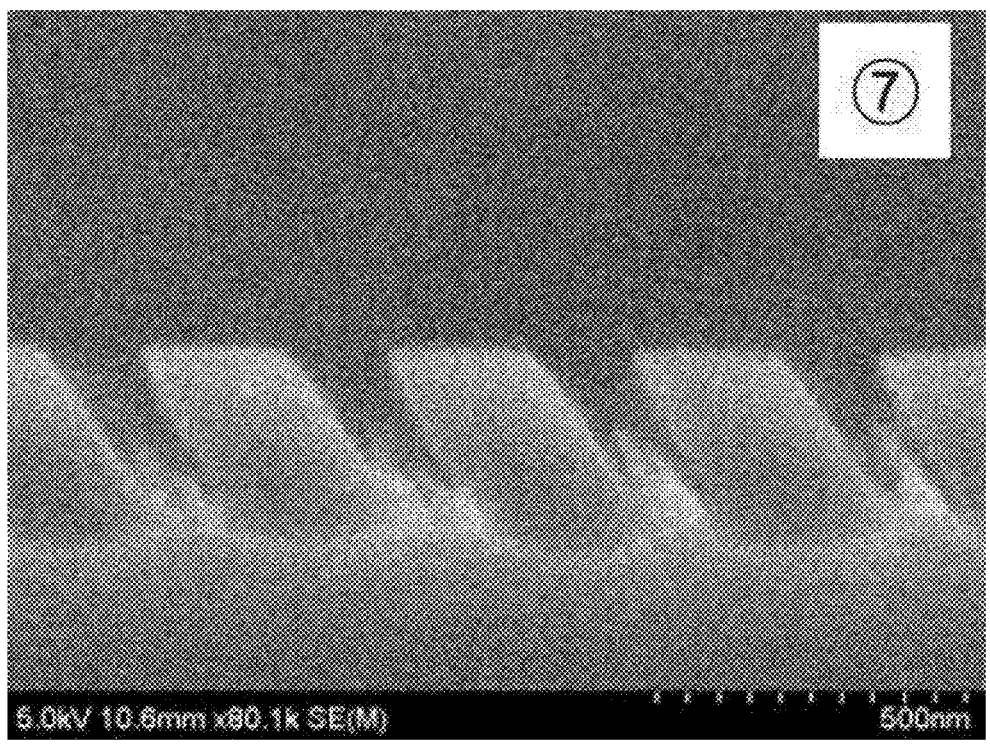

[Figure 8B]
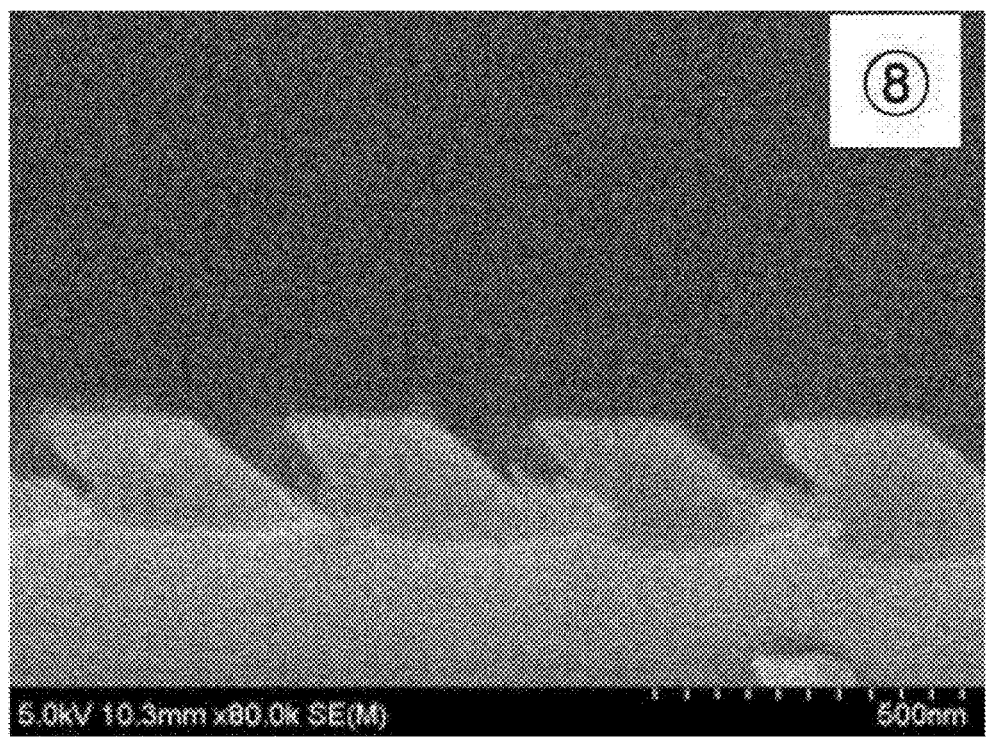

[Figure 8C]
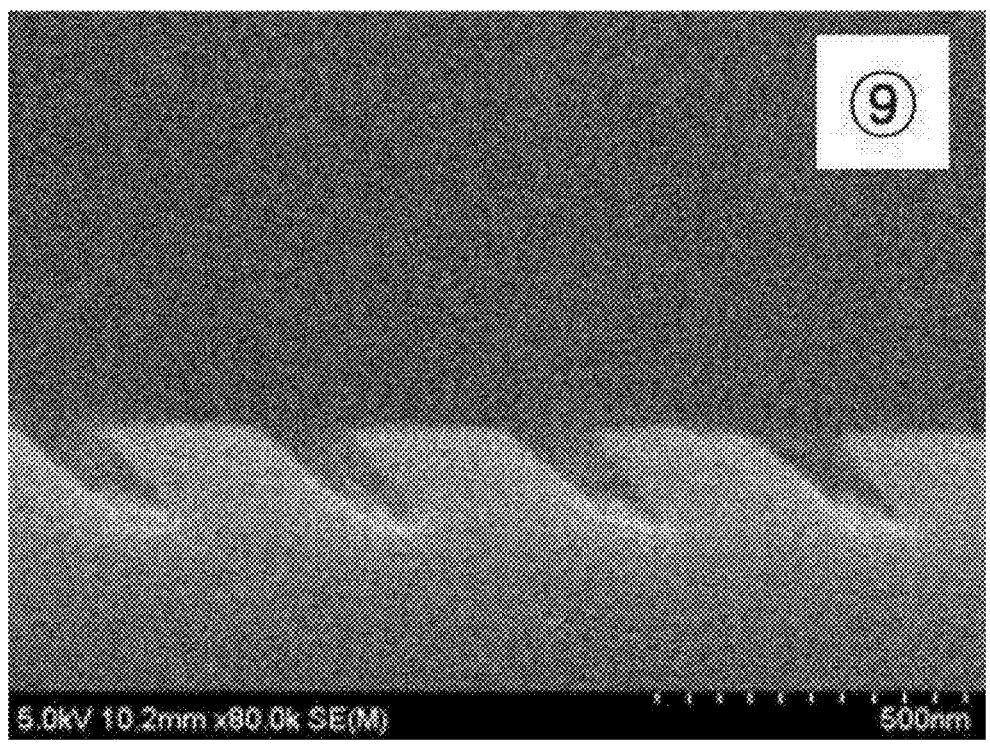

[Figure 9A]
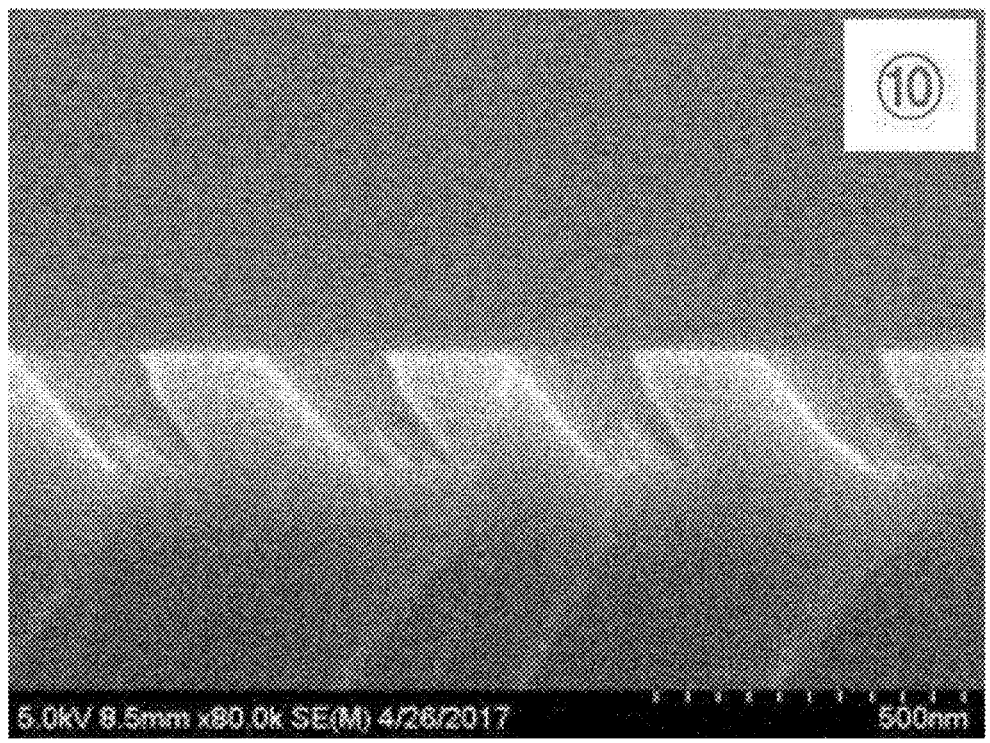

[Figure 9B]
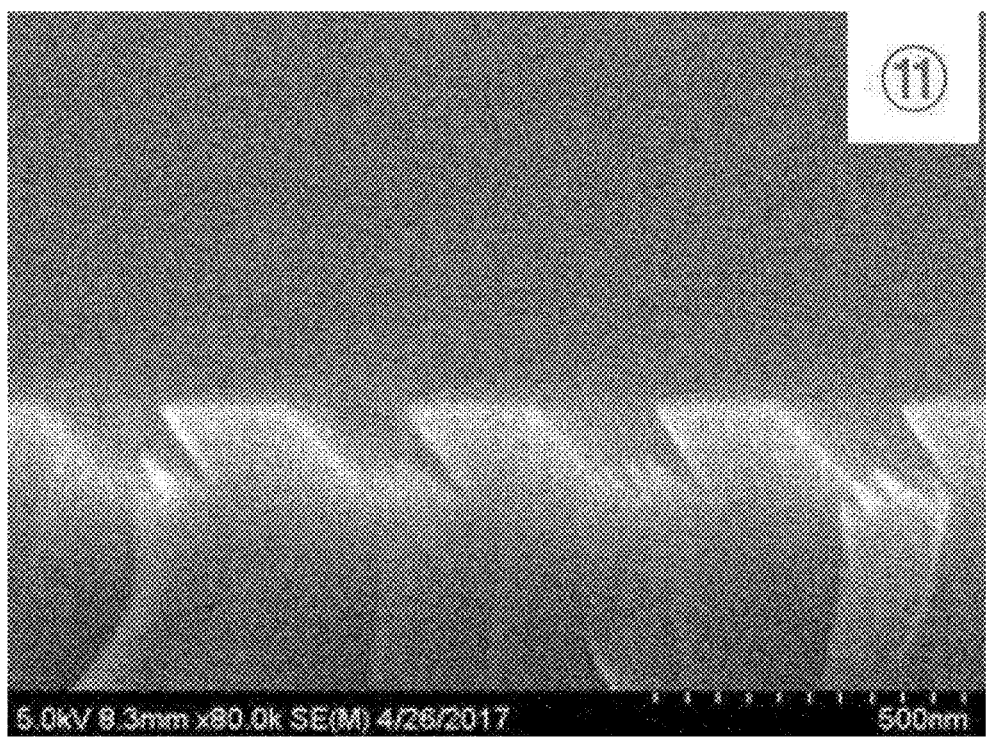

[Figure 10]
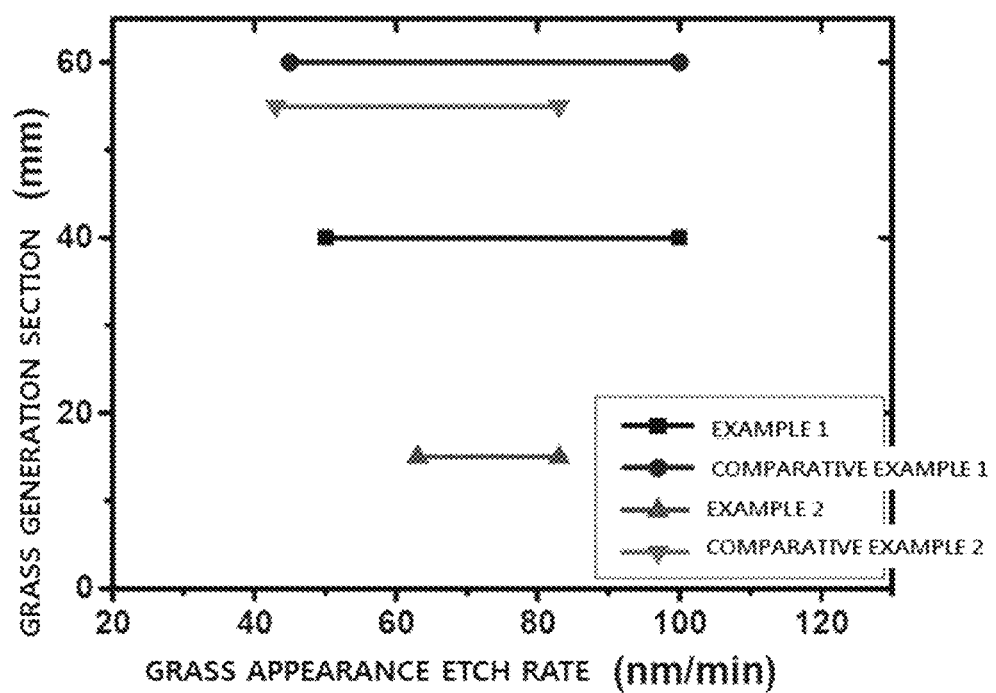

[Figure 11]
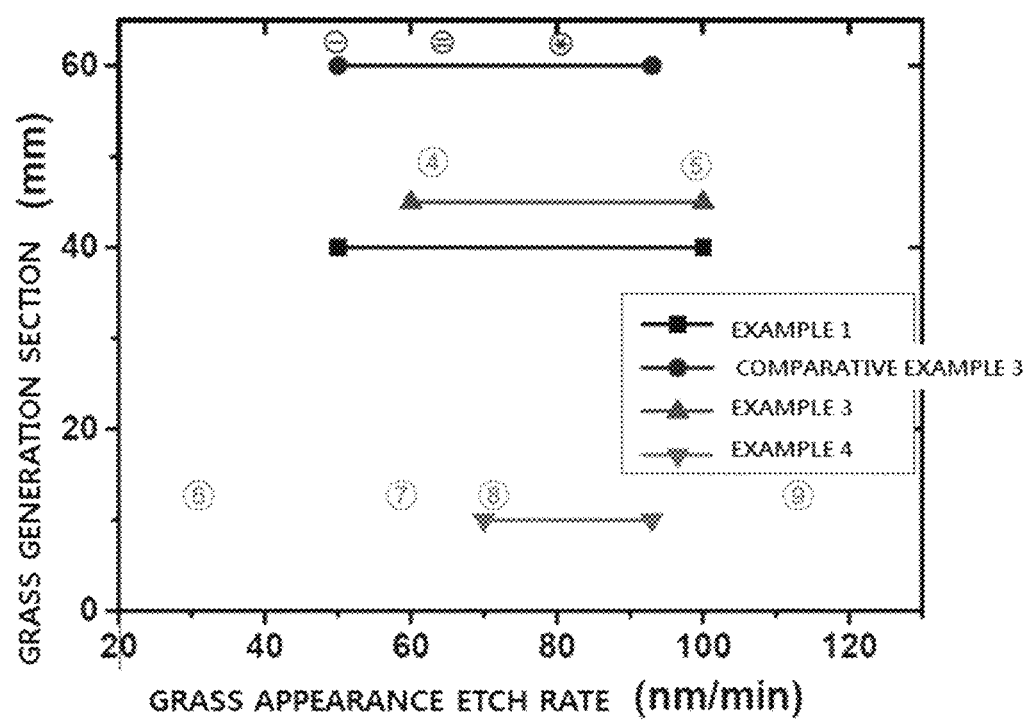

[Figure 12A]
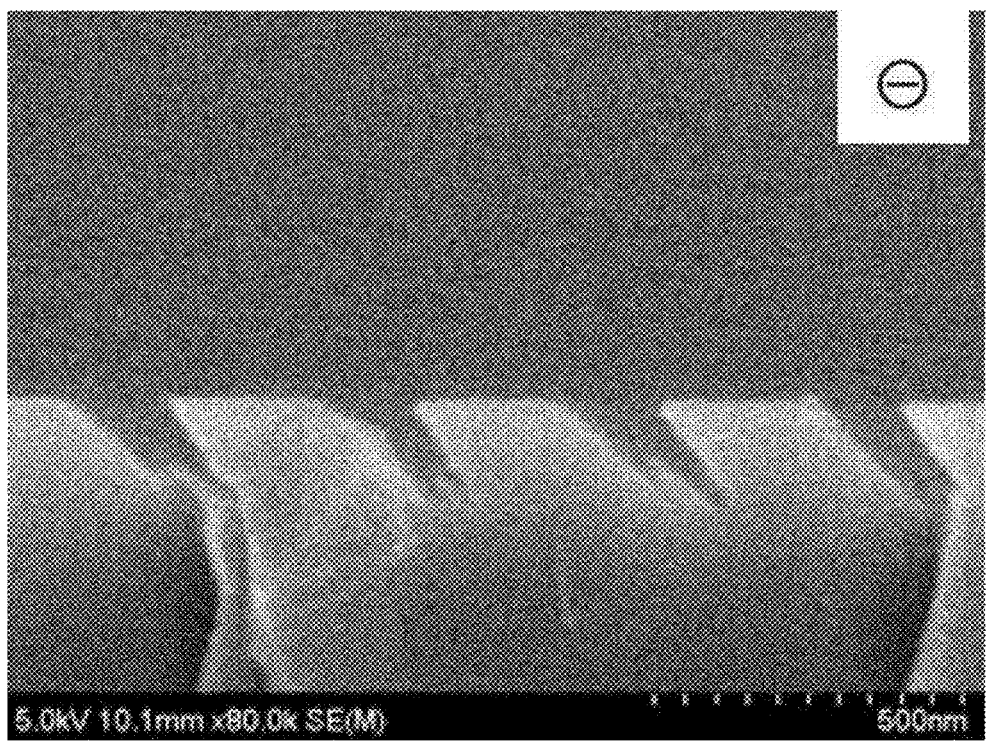

[Figure 12B]
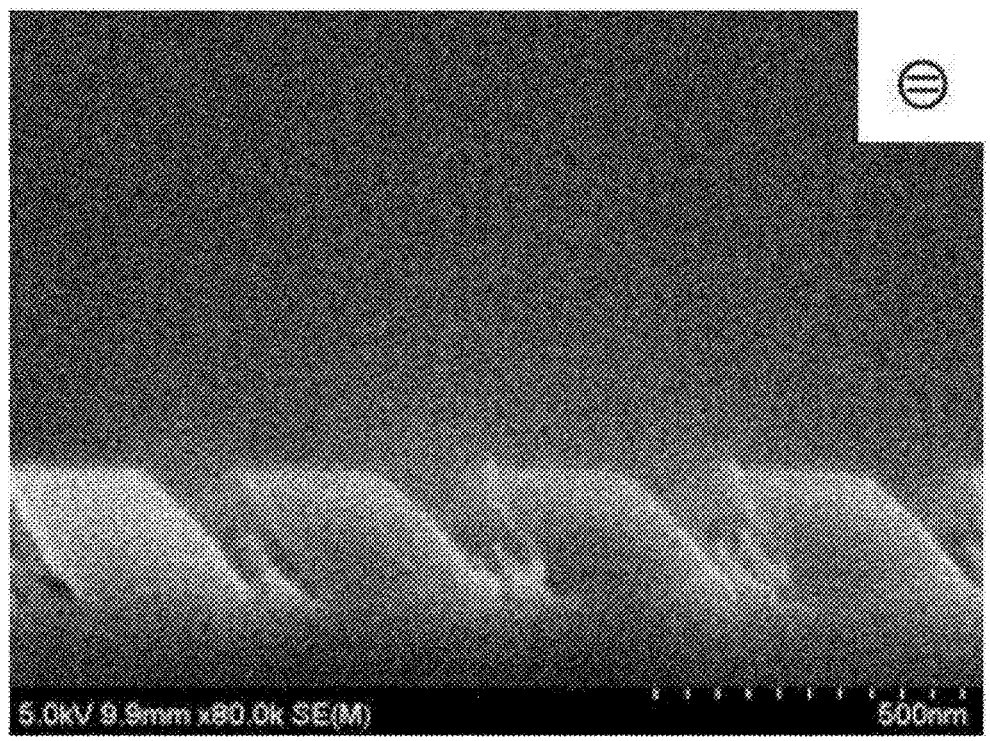

[Figure 12C]
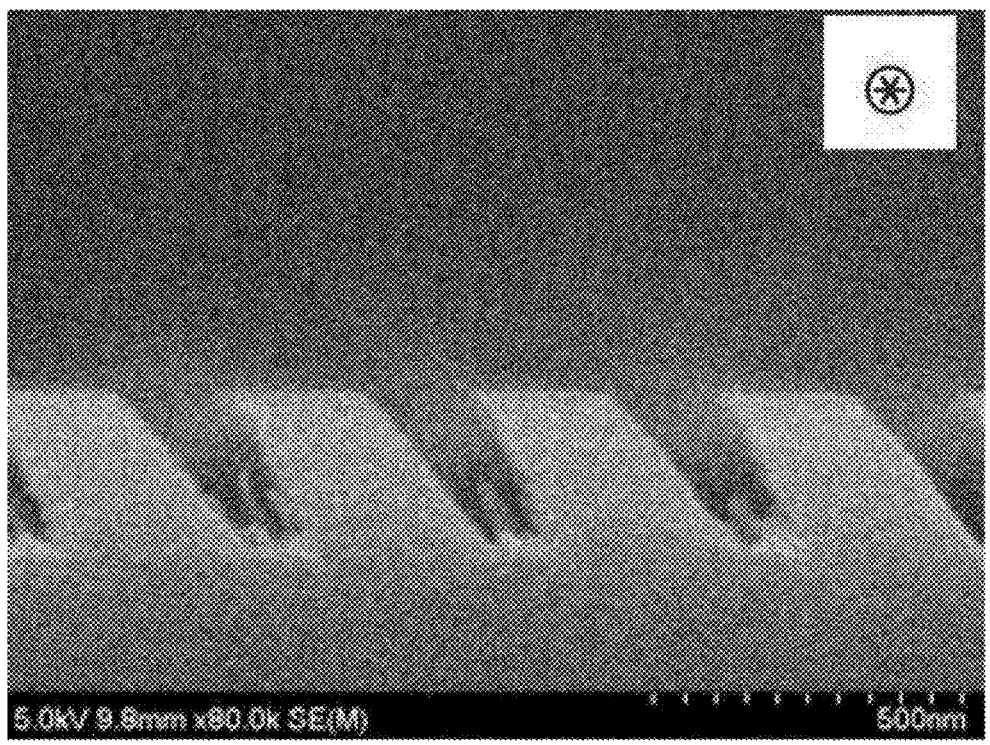

[Figure 13A]
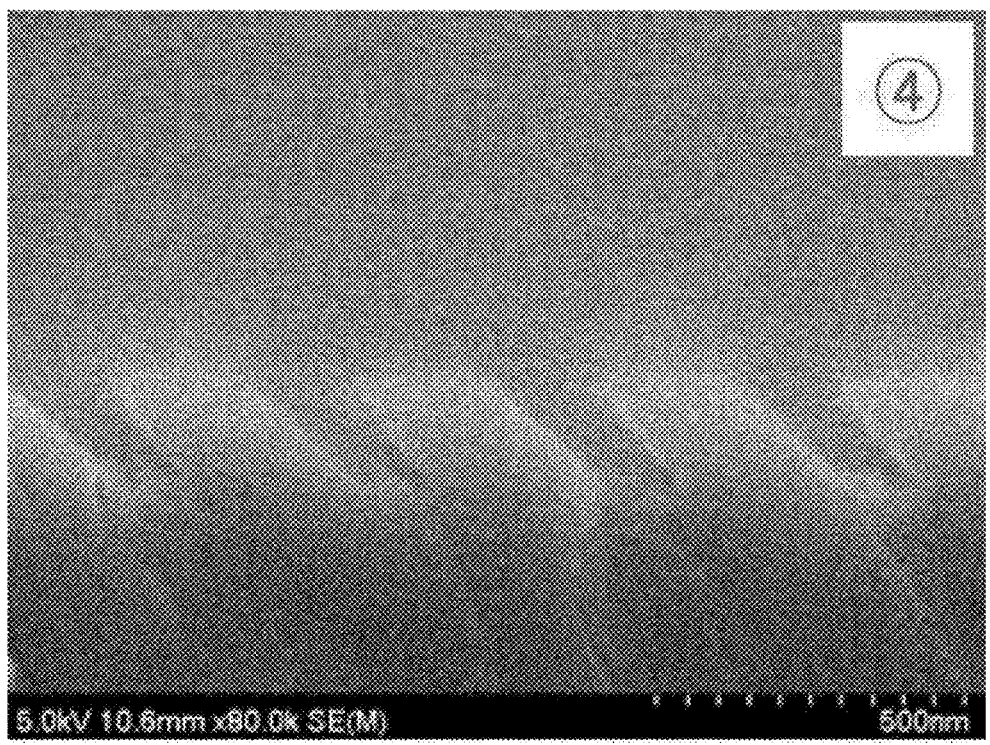

[Figure 13B]
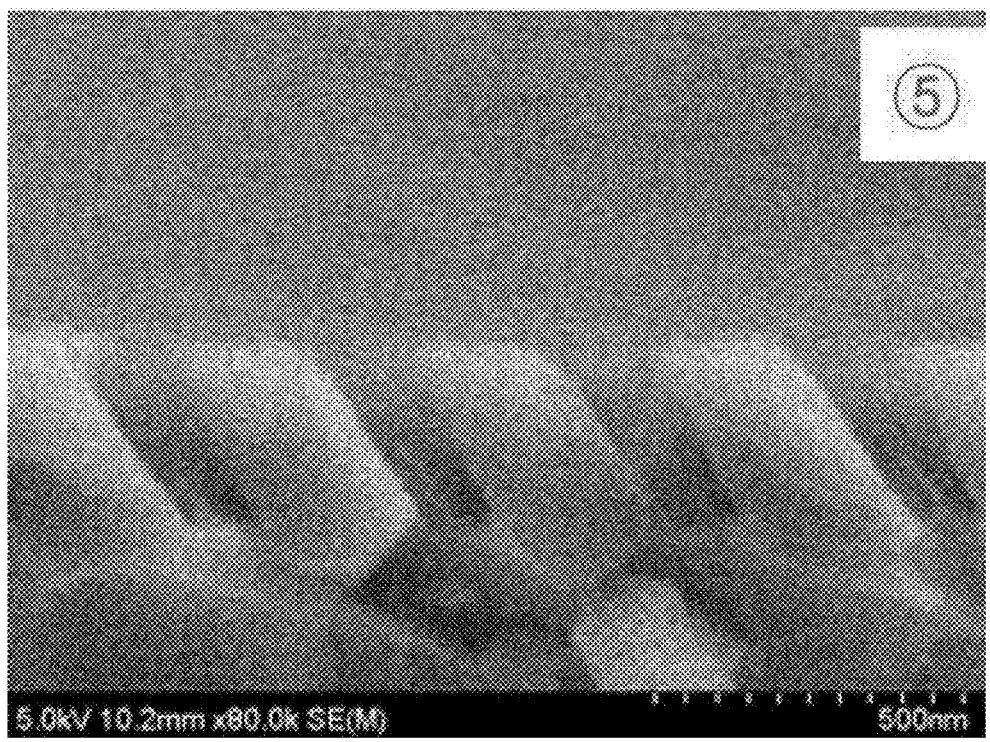

[Figure 14A]
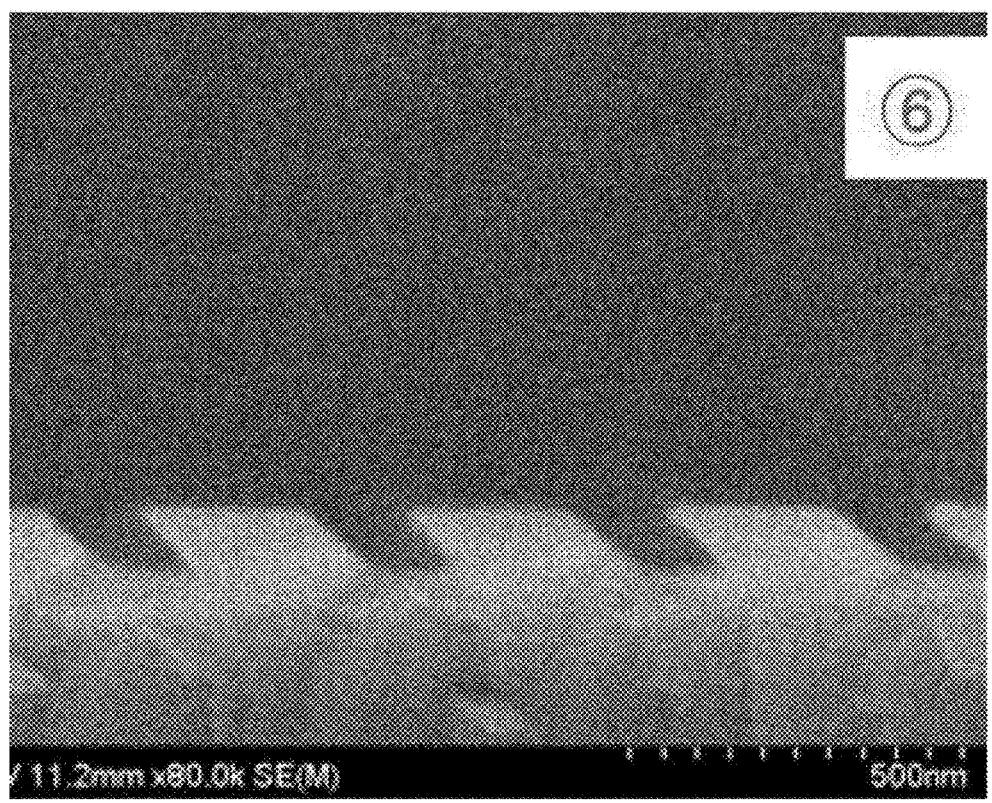

[Figure 14B]
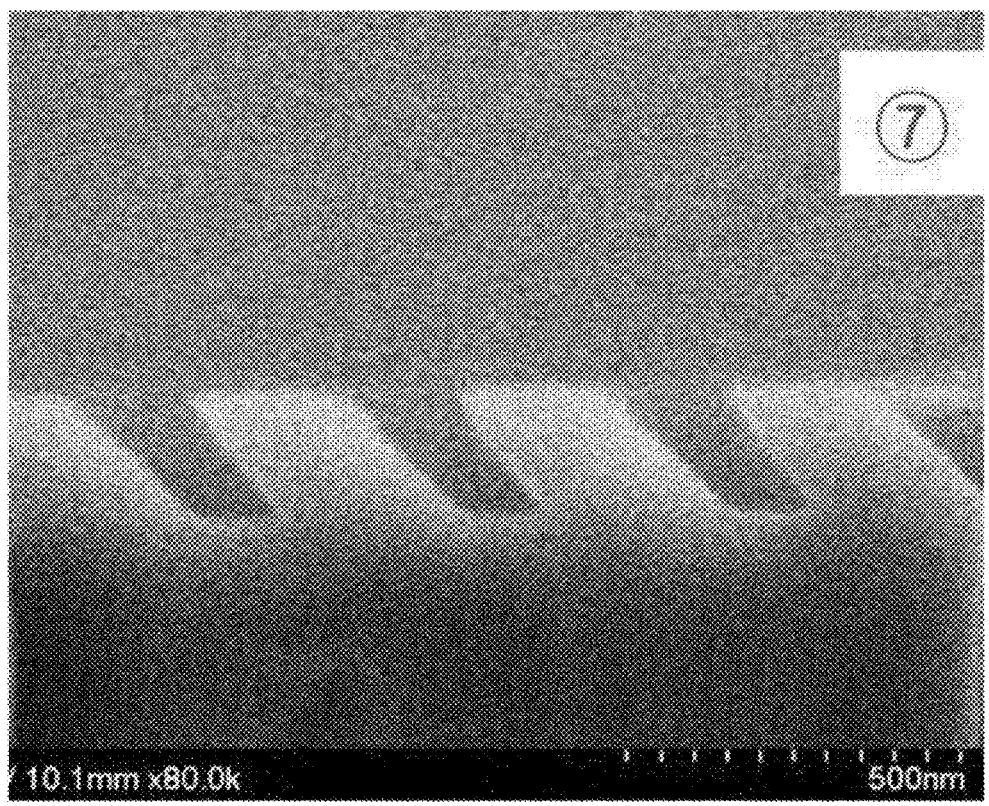

[Figure 14C]
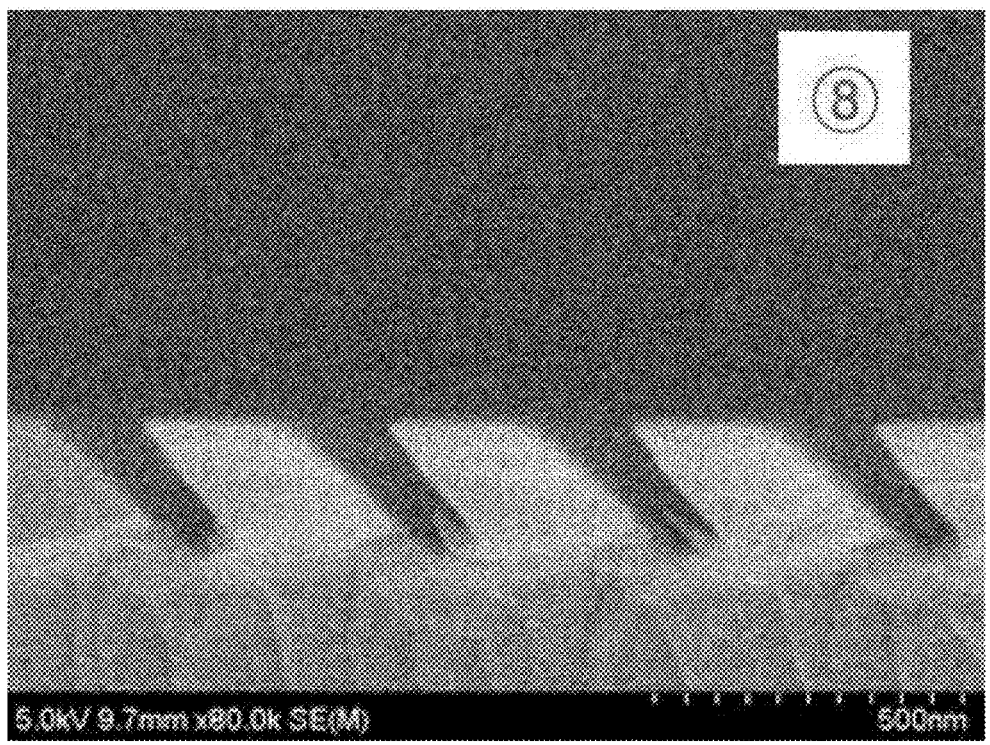

[Figure 14D]
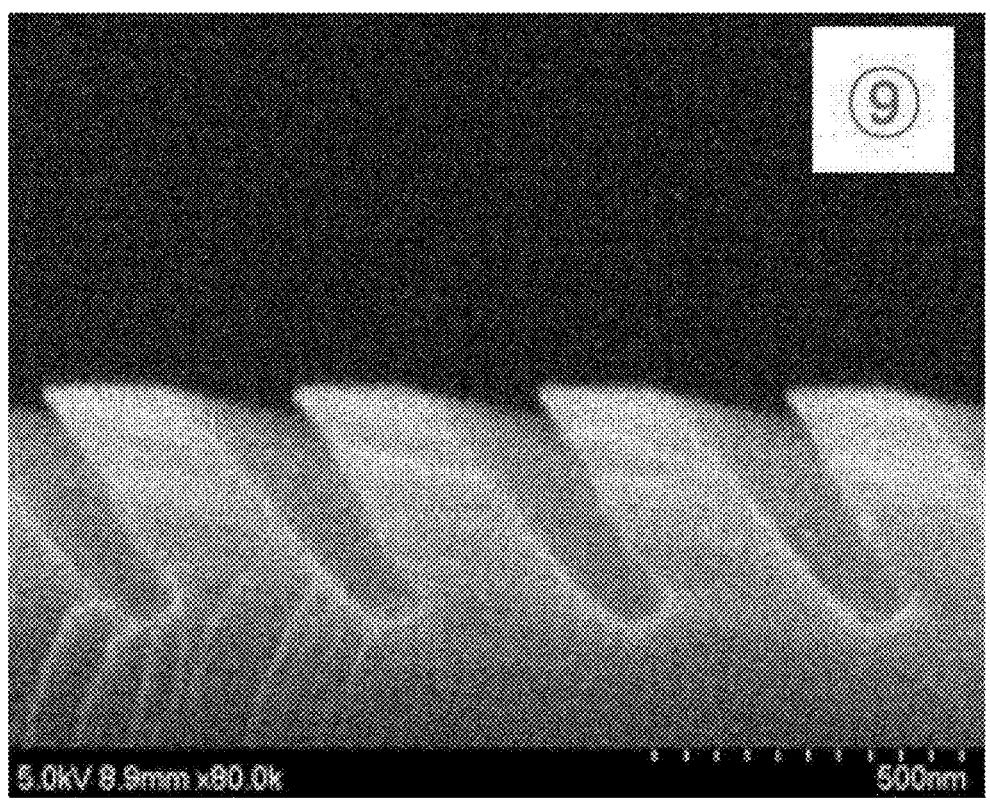

PLASMA ETCHING METHOD USING FARADAY CAGE

CROSS-REFERENCE TO RELATED APPLICATIONS

This is a U.S. national stage of international application No. PCT/KR2018/012373, filed on Oct. 19, 2018, and claims priority to and the benefit of Korean Patent Application No. 10-2017-0136547 filed in the Korean Intellectual Property Office on Oct. 20, 2017, the entire contents of which are incorporated herein by reference.

FIELD

This specification relates to a plasma etching method using a Faraday cage.

BACKGROUND

In order to display a desired image to a user on a display, a light guide plate for changing a state of visible light can be used. The light guide plate can interact with visible light incident through reflection, refraction, or diffraction, and can allow the user to see the desired image by controlling such an interaction. The light incident on the light guide plate may interact with a structure provided on the light guide plate, and diffraction may occur. This is caused by a wave nature of the light, and may be expressed by interference of light waves. When the light incident on the light guide plate meets a periodic structure, the light is divided into beams in different directions by the diffraction of the light to be viewed by the user.

In order to display a desired image to the user on the display, a light guide plate for changing a state of visible light can be used. The light guide plate can interact with visible light incident through reflection, refraction, or diffraction, and can allow the user to see the desired image by controlling such an interaction. The light incident on the light guide plate may interact with a structure provided on the light guide plate, and diffraction may occur. This is caused by a wave nature of the light, and may be expressed by interference of light waves. When the light incident in the light guide plate meets a periodic structure, the light is divided into beams of different directions by the diffraction of the light to be viewed by the user.

It is necessary to study a method for forming a microstructure of the light guide plate so that the light incident on the light guide plate is output at a constant intensity on the display in order to display the desired image to the user through the display without distortion.

Relevant Patent Document:
Korean Patent Registration No. KR 10-1131101 B1

SUMMARY

The present invention has been made in an effort to provide a plasma etching method using a Faraday cage.

However, the object to be solved by the present invention is not limited to the aforementioned object and other objects, which are not mentioned above, will be apparent to a person having ordinary skill in the art from the following description.

An embodiment of the present invention provides a plasma etching method using a Faraday cage, which includes; providing a Faraday cage having a mesh portion on an upper surface thereof in a plasma etching apparatus; providing a quartz substrate having a metal mask with an opening on one surface thereof in the Faraday cage; and patterning by etching the quartz substrate with plasma etching, in which a bottom surface of the Faraday cage includes metal having a lower ionization tendency than the metal mask.

By an etching method according to an embodiment of the present invention, formation of a needle-shaped structure generated on a bottom surface of an etching portion during etching of a quartz substrate by plasma etching can be minimized. Specifically, by an etching method according to an embodiment of the present invention, the formation of the needle-shaped structure can be effectively controlled, which is formed on the bottom surface of the etching portion by a simple method for approximately selecting a metallic material of the bottom surface of a Faraday cage and the metallic material of a metal mask.

By an etching method according to an embodiment of the present invention, there is an advantage that different inclined pattern portions can be simultaneously formed on a substrate through one etching process.

An etching method according to an embodiment of the present invention is advantageous in that a mold substrate for a diffraction grating light guide plate having excellent precision can be manufactured by a simple process.

An etching method according to an embodiment of the present invention is advantageous in that an inclined pattern with a uniform slope can be formed on a quartz substrate and the inclined pattern can be controlled to have a depth gradient.

BRIEF DESCRIPTION OF DRAWINGS

FIG. 1 schematically illustrates an etching method according to an embodiment of the present invention.

FIG. 2 is an exemplary illustration of a diffraction grating light guide plate manufactured using a patterned quartz substrate manufactured by an embodiment of the present invention.

FIG. 3 schematically illustrates a method for identifying a high-etched region of a Faraday cage according to Reference Example 1 and Reference Example 2.

FIGS. 4A and 4B are images of the high-etched region of the Faraday cage according to Reference Example 1 and Reference Example 2, respectively.

FIG. 5 are plots of the vertical etching depths at various positions on an inclined surface according to Examples 1 and 2 and Comparative Examples 1 and 2.

FIGS. 6A and 6B are scanning electron microscope (SEM) images of an etched portion of a glass substrate according to Example 1.

FIGS. 7A to 7D are SEM images of an etched portion of a glass substrate according to Example 2.

FIGS. 8A to 8C are SEM images of an etched portion of a glass substrate according to Comparative Example 1.

FIGS. 9A and 9B are SEM images of an etched portion of a glass substrate according to Comparative Example 2.

FIG. 10 are plots of the data of FIG. 5 converted into an etch rate at which a needle-shaped structure is generated as a function of the section in which the needle-shaped structure is generated.

FIG. 11 are plots of the vertical etching depths at various positions during inclined etching according to Example 1, Examples 3 and 4, and Comparative Example 3 converted into the etch rate at which the needle-shaped structure is generated as a function of the section in which the needle-shaped structure is generated.

FIGS. 12A to 12C are SEM images of an etched portion of a glass substrate according to Comparative Example 3.

FIGS. 13A and 13B are SEM images of an etched etching portion of a glass substrate according to Example 3.

FIGS. 14A to 14D are SEM images of an etched etching portion of a glass substrate according to Example 4.

DETAILED DESCRIPTION

Throughout the specification, a case where a part "comprises" an element will be understood to imply the inclusion of stated elements but not the exclusion of any other elements unless explicitly described to the contrary.

In this specification, it will be understood that when a member is referred to as being "on" the other member, one member can be directly on the other member or another member may also be present between both members. In the specification, the term of a degree used "step (of~)" or "step of~" does not mean "step for".

In the present invention, a Faraday cage means a closed space made of a conductor and when the Faraday cage is installed in plasma, a sheath is formed on an outer surface of a cage and an electric field is kept constant inside the cage. In this case, when an upper surface of the Faraday cage is formed by the mesh portion, the sheath is formed along the surface of the mesh portion. Therefore, in the case of performing plasma etching using the Faraday cage, ions accelerated in a direction perpendicular to the sheath formed horizontally on the surface of the mesh portion are incident on the inside of the Faraday cage and then, reach the substrate while maintaining directionality when being incident to etch the substrate. Furthermore, in the present invention, the surface of the substrate inside the Faraday cage is fixed in a horizontal or inclined state with respect to a mesh surface and the ions are incident in a direction perpendicular to the mesh surface, and as a result, the substrate may be etched in a direction perpendicular or inclined to the surface of the substrate. Specifically, the Faraday cage according to an embodiment of the present invention may be a conductive box formed by the mesh portion having a conductive upper surface. Further, according to an embodiment of the present invention, an etching direction of the plasma etching may be a direction perpendicular to the surface of the mesh portion of the Faraday cage.

In the case of the plasma etching using the Faraday cage, the ions passing through the mesh portion collide with neutral particles existing in the inside of the Faraday cage while moving toward the substrate, so that kinetic energy is lost, and as a result, a density of the ions tends to be inversely proportional to a distance of the mesh portion. That is, the closer to the mesh portion on which the ions are incident, the higher an etch rate and the further away from the mesh portion, the lower the etch rate. Plasma etching using the Faraday cage in the related art cannot but be limitatively used due to a problem of etching uniformity when a diameter of the substrate increases or when the distance between the mesh portion and the bottom of the substrate becomes too large in inclined etching. Specifically, it is difficult to increase accuracy of etching when a high etching area and a low etching area are irregularly mixed for each position of the Faraday cage during the plasma etching using the Faraday cage in the related art and there is a limitation such as an ion beam dispersion effect in which the diameter of the ion beam increases when a progress distance of the ion is longer.

In addition, there is a problem that a needle-shaped structure having low reflectance is formed in the etching area by plasma etching, specifically, a self-masking mechanism in an etching process of a quartz substrate using an inductively coupled plasma reactive ion etching apparatus (ICP-RIE). Such the needle-shaped structure is also called a black silicon, and is present in the etching area in the shape of a needle a diameter of several tens to several hundreds of nm, which greatly decreases the reflectance of the surface of the quartz substrate and functions as an element that interferes with precise etching.

As a result of continuing a research on the plasma etching using the Faraday cage, the present inventors have drawn the following invention by finding factors that may suppress generation of the needle-shaped structure.

Hereinafter, this specification will be described in more detail.

An embodiment of the present invention provides a plasma etching method using a Faraday cage, which includes; providing a Faraday cage having a mesh portion on an upper surface thereof in a plasma etching apparatus; providing a quartz substrate having a metal mask with an opening on one surface thereof in the Faraday cage; and patterning by etching the quartz substrate with plasma etching, in which a bottom surface of the Faraday cage includes metal having a lower ionization tendency than the metal mask.

As a result of continuing the research on the plasma etching using the Faraday cage, the present inventors have found that the formation of the needle-shaped structure generated in the quartz substrate to be etched may be controlled according to a difference in ionization tendency between a material of the bottom surface of the Faraday cage and a metal mask material for patterning. Specifically, the present inventors have found that the ionization tendency of the material of the bottom surface of the Faraday cage should be lower than the ionization tendency of the metal mask material, thereby minimizing the generation of the needle-shaped structure when patterning the quartz substrate.

According to an embodiment of the present invention, the quartz substrate may be a glass or silicon wafer.

According to an embodiment of the present invention, the bottom surface of the Faraday cage may include metal whose standard reduction potential is higher than a standard reduction potential of the metal mask by 1 V or more. Specifically, the bottom surface of the Faraday cage may be made of the metal whose standard reduction potential is higher than the standard reduction potential of the metal mask by 1 V or more. Further, an average standard reduction potential of the metal constituting the bottom surface of the Faraday cage may be higher than the standard reduction potential of the metal mask by 1 V or more. The average standard reduction potential of the metal constituting the bottom surface of the Faraday cage may be calculated in consideration of the content of the metal constituting the bottom surface of the Faraday cage and the standard reduction potential. For example, for SUS304 consisting of 18 wt % Cr, 8 wt % Ni, and 74 wt % Fe, the average standard reduction potential may be −0.333 V. For reference, the standard reduction potential of Cr is −0.74 V, the standard reduction potential of Fe is −0.45 V, the standard reduction potential of Ni is −0.26 V, the standard reduction potential of Al is −1.66 V, and the standard reduction potential of Cu is 0.34 V.

According to an embodiment of the present invention, the bottom surface of the Faraday cage may include metal whose standard reduction potential is higher than the standard reduction potential of the metal mask by 1 V or more, 1.5 V or more, or 1.9 V or more. Further, according to an embodiment of the present invention, the average standard reduction potential of the metal constituting the bottom surface of the Faraday cage may be higher than the standard reduction potential of the metal mask by 1 V or more, 1.5 V or more, or 1.9 V or more.

In the case where the standard reduction potential of the metal included in the bottom surface of the Faraday cage is described above, generation of the needle-shaped structure during patterning of the quartz substrate may be minimized and furthermore, the size of the generated needle-shaped structure may be minimized.

According to an embodiment of the present invention, the metal mask includes at least one of aluminum and chromium. Specifically, the metal mask may be made of aluminum.

According to an embodiment of the present invention, the bottom surface of the Faraday cage may include at least one of iron, nickel, and copper. Specifically, the bottom surface of the Faraday cage may be a metal plate made of stainless steel, which is copper or an alloy of iron, chromium, and nickel.

According to an embodiment of the present invention, the metal mask is an aluminum made mask, and the bottom surface of the Faraday cage may be a copper made or SUS304 stainless steel made metal plate.

According to an embodiment of the present invention, the metal mask may include at least one of aluminum and chromium and the bottom surface of the Faraday cage may include copper. Specifically, the metal mask may be made of aluminum having a purity of 95% or more and the bottom surface of the Faraday cage may be a copper plate having a purity of 95% or more.

Like the present invention, when the ionization tendency of the bottom surface material of the Faraday cage is lower than the ionization tendency of the metal mask material and/or the standard reduction potential of the bottom surface material of the Faraday cage is higher than the standard reduction potential of the metal mask material by 1 V or higher, the generation of the needle-shaped structure during patterning of the quartz substrate may be remarkably suppressed and the size of the generated needle-shaped structure may be remarkably suppressed to be small.

According to an embodiment of the present invention, the patterning may include adjusting an output of the plasma etching apparatus to 0.75 kW to 4 kW. Specifically, the output of the plasma etching apparatus may be adjusted to 0.75 kW to 3 kW, 0.75 kW to 1.5 kW, or 0.75 kW to 1 kW.

When the output of the plasma etching apparatus is adjusted within the above range, the formation of the needle-shaped structure may be further suppressed, which occurs when patterning the quartz substrate and the size of the generated needle-shaped structure may be significantly suppressed to be small.

According to an embodiment of the present invention, the patterning may include supplying mixed gas containing the reactive gas and oxygen gas to the plasma etching apparatus at a flow rate of 10 sccm to 75 sccm. Specifically, the patterning may include supplying to the plasma etching apparatus the mixed gas at a flow rate of 15 sccm to 75 sccm, 25 sccm to 70 sccm, 30 sccm to 70 sccm, 40 sccm to 60 sccm, or 45 sccm to 55 sccm.

When the supply flow rate of the reactive gas is adjusted within the above range, the formation of the needle-shaped structure may be further suppressed, which occurs when patterning the quartz substrate and the size of the generated needle-shaped structure may be significantly suppressed to be small.

According to an embodiment of the present invention, as the reactive gas, general reactive gas used in the plasma etching may be used. For example, gas including $SF_6$, $CHF_3$, $C_4F_8$, $CF_4$, and $C_{12}$ may be used.

According to an embodiment of the present invention, in the patterning, the mixed gas containing the reactive gas and the oxygen gas may be supplied to the plasma etching apparatus and a content of the flow rate of the oxygen gas in a total flow rate of the mixed gas may be 1% to 20%. Specifically, the content of the oxygen gas flow rate in the total flow rate of the mixed gas may be 1% to 15%, 1% to 10%, or 1% to 5%.

When the content of the oxygen flow rate in the flow rate of the mixed gas is within the above range, the formation of the needle-shaped structure may be further suppressed, which occurs when patterning the quartz substrate and the size of the generated needle-shaped structure may be significantly suppressed to be small.

According to an embodiment of the present invention, in the bottom surface of the etching portion of the patterned quartz substrate, a height of the needle-shaped structure may be controlled to 50 nm or less.

According to an embodiment of the present invention, in the bottom surface of the etching portion of the patterned quartz substrate, a diameter of the needle-shaped structure may be controlled to 50 nm or less.

At the time of plasma etching using a general Faraday cage, a needle-shaped structure having a height of 100 nm or more and a diameter of 50 nm or more is formed in the etched portion of the quartz substrate, and as a result, precision of patterning may deteriorate. Contrary to this, the etching method according to an embodiment of the present invention has an advantage that the formation of the needle-shaped structure generated during etching may be prevented or the height and the diameter of the generated needle-shaped structure may be suppressed to the above range by controlling the material of the metal mask and the material of the bottom surface of the Faraday cage.

The mesh portion of the Faraday cage draws free electrons on a contact surface with the plasma to form sheath during the plasma etching. Further, the mesh portion may have conductivity and may attract ions having positive charges and accelerate the attracted ions through the conductivity. Furthermore, the mesh portion may be provided flat on one surface of the Faraday cage and the etch rate at a curved portion may be locally varied when the curved portion exists.

According to an embodiment of the present invention, the mesh portion may have sheet resistance of 0.5Ω/□ or more. Specifically, according to an embodiment of the present invention, the sheet resistance of the mesh portion may be 0.5Ω/□ or more and 100Ω/□ or less.

When the sheet resistance of the mesh portion is 0.5Ω/□ or more, a high-etched region and a low-etched region may be formed constant in the Faraday cage during the plasma etching. Further, when the sheet resistance of the mesh portion is less than 0.5Ω/□, there is a problem that it is difficult to perform precise etching because the etch rate is irregularly formed for each position of the Faraday cage during the plasma etching. Furthermore, when the sheet resistance of the mesh portion is 0.5Ω/□ or more, a high-etched region and a low-etched region may be formed constantly in the Faraday cage and when the sheet resistance exceeds 100Ω/□, an increase of an effect may be insignificant and only manufacturing cost may increase.

According to an embodiment of the present invention, in the mesh portion, carbon fluoride radicals may be adsorbed on a metal mesh. Specifically, the fluorocarbon radical may be —CF, —CF$_2$, —CF$_3$, or —C$_2$F$_x$ (x=an integer of 1 to 5). Specifically, the fluorocarbon radicals may be adsorbed on the mesh portion by etching and surface polymerization by F radicals during the plasma etching in the mesh portion of the Faraday cage.

According to an embodiment of the present invention, in the mesh portion, the carbon fluoride radicals are adsorbed on a conductive material such as a metal to exhibit the sheet resistance described above.

According to an embodiment of the present invention, the mesh portion may adopt a mesh made of a stainless material. Specifically, a commercially available mesh of SUS304 material #200 (pitch: 125 μm, wire diameter: 50 μM, aperture ratio: 36%) may be used. However, the present invention is not limited thereto, and the mesh portion may be made of Al, Cu, W, Ni, Fe, or an alloy containing at least two of them. Furthermore, a porosity and a lattice size of the mesh may be freely adjusted according to a usage of the etching.

According to an embodiment of the present invention, the etching method may further include: verifying the high-etched region in the Faraday cage by providing a sample substrate on the bottom surface of the Faraday cage and performing plane plasma etching; and a support aligning step of preparing a support having an inclined surface and locating a lower region of the inclined surface at the high-etched region of the Faraday cage and in the providing of the quartz substrate in the Faraday cage, the quartz substrate may be provided on the inclined surface of the support.

In the verifying of the high-etched region in the Faraday cage, the sample substrate is provided on the bottom surface of the Faraday cage, plane etching using plasma etching is performed, and the etched sample substrate is examined to verify a distribution of the high-etched region and the low-etched region in the Faraday cage.

As described above, the Faraday cage according to the present invention has the mesh portion having the sheet resistance of 0.5Ω/□ or more, so that the high-etched region and the low-etched region in the Faraday cage may be formed constant and the high-etched region which is formed constant may be verified through the verifying of the high-etched region in the Faraday cage.

According to an embodiment of the present invention, the high-etched region may be shown to be linear on the sample substrate. The high-etched region may be shown as a linear or curved region having a small width with respect to a lower surface of the Faraday cage.

Therefore, according to an embodiment of the present invention, since the high-etched region may be shown to be linear with respect to the lower surface of the Faraday cage, it may be easy to place the mold substrate in the high-etched region. Therefore, an inclined pattern portion may be more precisely formed on the mold substrate, which has a depth gradient.

According to an embodiment of the present invention, after the verifying of the high-etched region in the Faraday cage, the sample substrate may be removed from the Faraday cage.

The sample substrate may be applied without a limitation if the etch rate may be verified for each region during the plasma etching.

According to an embodiment of the present invention, when a lower region of the inclined surface of the support is located in the high-etched region, an etching rate in the patterning step shows a tendency in which the etching rate is decreased from an upper region to a lower region of the inclined surface and inverted and increased. Specifically, the upper region of the inclined surface of the support located close to a mesh surface of the Faraday cage shows a high etching rate and the etching rate gradually decreases toward the lower region. Furthermore, since the lower region of the support is located in the high-etched region, the etching rate has a tendency in which the etching rate is inverted and gradually increased.

According to an embodiment of the present invention, the quartz substrate is provided on the inclined surface of the support to become an etching target using the tendency of the etching rate.

According to an embodiment of the present invention, in the patterning step, a first inclined pattern portion and a second inclined pattern portion may be simultaneously formed at one side and the other side of the quartz substrate, respectively, and the first inclined pattern portion may include an inclined groove pattern having the depth gradient and the second inclined pattern portion may include an inclined groove pattern having a depth deviation of 0 nm to 50 nm.

The first inclined pattern portion may be provided on one surface of the mold substrate provided at an upper side of the inclined surface and the second inclined pattern portion may be provided on one surface of the mold substrate provided at a lower side of the inclined surface. Further, the first inclined pattern portion may be provided on one surface of the mold substrate provided at the lower side of the inclined surface and the second inclined pattern portion may be provided on one surface of the mold substrate provided at the upper side of the inclined surface.

According to an embodiment of the present invention, in the plasma etching, inductively coupled plasma reactive ion etching equipment (ICP-RIE) may be used. Specifically, the patterning may be performed by providing the Faraday cage in the inductively coupled plasma reactive ion etching equipment (ICP-RIE). In addition, the plasma etching may also adopt a helicon plasma scheme, a helical resonance plasma scheme, or an electron resonance plasma scheme.

According to an embodiment of the present invention, the etching rate in the patterning may be decreased from the upper region to the lower region of the inclined surface and inverted and increased.

According to an embodiment of the present invention, an etching direction in the patterning may be a direction vertical to the lower surface of the Faraday cage. Since the etching direction in the patterning is the direction vertical to the lower surface of the Faraday cage, the first inclined pattern portion and the second inclined pattern portion may be formed by using the support having the inclined surface.

According to an embodiment of the present invention, an inclination angle of the support may be 0° or more and 60° or less or 35° or more and 45° or less. By adjusting the inclination angle of the support, the inclination angles of the first inclined pattern portion and the second inclined pattern portion may be adjusted.

By adjusting the inclination angle of the support to the above range, an average inclination angle of patterns of the first inclined pattern portion and the second inclined pattern portion may be adjusted to 0° to 55° or 30° to 40°. For example, by adjusting the inclination angle of the support to 35°, minimum inclination angles of patterns of the first inclined pattern portion and the second inclined pattern portion may be adjusted to 27°, a maximum inclination angle may be adjusted to 36°, and the average inclination angle may be adjusted to 33°. Further, by adjusting the inclination angle of the support to 40°, the minimum inclination angles of the patterns of the first inclined pattern portion and the second inclined pattern portion may be adjusted to 32°, the maximum inclination angle may be adjusted to 40°, and the average inclination angle may be adjusted to 36°.

According to the present invention, the sheet resistance of the mesh portion of the Faraday cage is adjusted to adjust the tendency of the plasma etch rate in the Faraday cage and the position of the support having the inclined surface is adjusted to manufacture the first inclined pattern portion and the second inclined pattern portion through one process.

According to an embodiment of the present invention, the metal mask may be used for forming the first inclined pattern portion and the second inclined pattern portion and an opening pattern portion of the mask may be regions corresponding to the first inclined pattern portion and the second inclined pattern portion.

According to an embodiment of the present invention, the first inclined pattern portion may include an inclined groove pattern having the depth gradient. Specifically, according to an embodiment of the present invention, the first inclined pattern portion may be formed in a region before the etching rate is inverted and increased or a region where the etching rate is inverted and increased.

According to an embodiment of the present invention, the first inclined pattern portion may include a region where a depth of a groove pattern gradually increases or decreases. Specifically, when the first inclined pattern portion is formed on the upper side of the inclined surface of the support, the depth of the groove pattern may gradually decrease toward a central region of the quartz substrate. Further, when the first inclined pattern portion is formed on the lower side of the inclined surface of the support, the depth of the groove pattern may gradually decrease toward the central region of the quartz substrate.

According to an embodiment of the present invention, a difference between a minimum depth and a maximum depth of an inclined groove pattern of the first inclined pattern portion may be 100 nm to 200 nm.

According to an embodiment of the present invention, the second inclined pattern portion may include an inclined groove pattern having a depth gradient of 0 nm to 50 nm. Specifically, the second inclined pattern portion is formed in a relatively narrow region, and as a result, the depth of the groove pattern may be constant.

According to an embodiment of the present invention, the depth of the inclined groove pattern of the second inclined pattern portion may be 70% to 130% of the maximum depth of the inclined groove pattern of the first inclined pattern portion. Specifically, according to an embodiment of the present invention, the depth of the inclined groove pattern of the second inclined pattern portion may be 80% to 120% of the maximum depth of the inclined groove pattern of the first inclined pattern portion.

According to an embodiment of the present invention, a difference between the etch rate at an uppermost portion of the inclined surface and the etch rate at a lowermost portion of the inclined surface may be within 30%. Specifically, according to an embodiment of the present invention, a difference between the etch rate at the uppermost portion of the inclined surface and the etch rate at the lowermost portion of the inclined surface may be within 20%.

Specifically, since the etch rate in the patterning shows a high etch rate at upper and lower portions of the inclined surface of the support, the depth of the inclined groove pattern of the second inclined pattern portion and the maximum depth of the inclined groove pattern of the first inclined pattern portion may be made to be similar to each other.

According to an embodiment of the present invention, the support may include metal having a standard reduction potential equal to or more than the standard reduction potential of the metal mask.

FIG. 1 is a diagram schematically illustrating an etching method according to an embodiment of the present invention. Specifically, FIG. 1 illustrates that the support having the inclined surface is provided in the Faraday cage and then, the quartz substrate is provided on the inclined surface and the substrate is patterned by using the plasma etching. As illustrated in FIG. 1, the upper and lower portions of the inclined surface of the support have the high etch rate, and a middle portion of the inclined surface has a relatively low etch rate.

According to an embodiment of the present invention, the second inclined pattern portion may be a region corresponding to a region of the diffraction grating light guide plate on which light is incident. Further, the first inclined pattern portion may correspond to a region of the diffraction grating light guide plate from which light is extracted.

FIG. 2 illustrates an example of a diffraction grating light guide plate manufactured using a patterned quartz substrate manufactured by a manufacturing method according to an embodiment of the present invention. Specifically, FIG. 2 illustrates a diffraction grating light guide plate manufactured using the patterned quartz substrate and illustrates that the light is incident on a region corresponding to the first inclined groove pattern of the diffraction grating light guide plate and then, the light is extracted to a region corresponding to the second inclined groove pattern to provide display information to a user. In the region corresponding to the second inclined groove pattern, an inclined pattern structure has a height gradient, so that predetermined light may be extracted according to the position.

According to an embodiment of the present invention, the patterned quartz substrate may be a mold substrate for the diffraction grating light guide plate. Specifically, in the patterning step, a diffraction grating pattern may be formed in the quartz substrate. More specifically, the diffraction grating pattern may be the first inclined pattern portion and the second inclined pattern portion described above.

An embodiment of the present invention provides a method for manufacturing a diffraction grating light plate guide, which includes: preparing a quartz substrate in which a diffraction grating pattern is formed by using a plasma etching method using the Faraday cage; applying a resin composition onto a quartz substrate on which the diffraction grating pattern is formed; providing a transparent substrate on an opposite side of a surface provided with the diffraction grating pattern; forming the diffraction grating pattern by curing the resin composition; and forming a diffraction grating light guide plate by separating the quartz substrate and the diffraction pattern.

The resin composition may be used without limitation as long as the resin composition is a resin composition generally used in the art. Furthermore, the applying of the resin composition may be performed by using a coating method generally used in the art, such as spin coating, dip coating, drop casting, etc.

The method for manufacturing the diffraction grating light guide plate may adopt a method for forming a general pattern layer except that the quartz substrate patterned by the plasma etching method using the Faraday cage is used.

The diffraction grating light guide plate may be used as a direct diffraction grating light guide plate. Further, a final product may be manufactured by a method of using the diffraction grating light guide plate as an intermediate mold and replicating the diffraction grating light guide plate. Specifically, when the diffraction grating light guide plate is manufactured after the mold for the diffraction grating light guide plate is manufactured by using the manufactured diffraction grating light guide plate as the intermediate mold, the slope of the grating pattern of the diffraction grating light guide plate used as the intermediate mold may be inverted. Furthermore, when the diffraction grating light guide plate is manufactured after the mold for the diffraction grating light guide plate is manufactured by using the diffraction grating light guide plate of which the slope of the grating pattern is inverted as the intermediate mold, a grating pattern in the same direction as an initial diffraction grating light guide plate may be implemented.

[Mode for Invention]

Hereinafter, the present invention will be described in detail with reference to examples for a specific description. However, the examples according to the present invention may be modified in various forms, and it is not interpreted that the scope of the present invention is limited to the examples described below. The examples of this specification will be provided for more completely explaining the present invention to those skilled in the art.

Reference Example 1

A Faraday cage in which sheet resistance of the mesh portion is $0.5605\Omega/\square$ and the bottom surface is a stainless (SUS304) plate was prepared. In addition, the Faraday cage was provided in an inductively coupled plasma reactive ion etching equipment (ICP-RIE) (Oxford's plasmaLab system 100) and then, a high-etched region in the Faraday cage was verified by performing plane etching.

Reference Example 2

A Faraday cage in which the sheet resistance of the mesh portion is $0.23\Omega/\square$ and the bottom surface is the stainless (SUS304) plate was prepared. In addition, the Faraday cage was provided in an inductively coupled plasma reactive ion etching equipment (ICP-RIE) (Oxford's plasmaLab system 100) and then, a high-etched region in the Faraday cage was verified by performing plane etching.

FIG. 3 is a schematic view for identifying a high-etched region of a Faraday cage according to Reference Example 1 and Reference Example 2.

Furthermore, conditions and sheet resistance results at the time of measuring the sheet resistance of the mesh portion of the Faraday cage according to Reference Examples 1 and 2 were shown in Table 1 below.

TABLE 1

|  | Reference Example 1 | Reference Example 2 |
|---|---|---|
| V (V) | 0.2 | 0.2 |
| I (A) | 0.223 | 0.54 |
| R ($\Omega$) | 0.8969 | 0.37 |
| Rs ($\Omega/\square$) | 0.5605 | 0.23 |

FIGS. 4A and 4B are images of the high-etched region of the Faraday cage according to Reference Example 1 and Reference Example 2, respectively. Specifically, FIGS. 4A and 4B are images of a high-etched region in the Faraday cage by performing plane etching after the Faraday cage according to each of Reference Examples 1 and 2, respectively, is provided in an inductively coupled plasma reactive ion etching equipment (ICP-RIE). In FIGS. 4A and 4B, a bright region indicates the high-etched region. In the case of the Faraday cage according to Reference Example 2, which has a mesh portion having a low sheet resistance value, it can be seen that the high-etched region is very irregular and is distributed in a wide region. Contrary to this, in the case of the Faraday cage according to Reference Example 1, which has a mesh portion having a sheet resistance value of $0.5\Omega/\square$ or more, it can be seen that a linear high-etched region having a small width is shown.

Example 1

Further, Al was deposited on a glass substrate having a thickness of 2 mm to form an Al layer. Further, after photoresist is spin-coated on the Al layer, the photoresist is developed by UV curing using a photomask having a pitch of 405 nm, and then the Al layer is selectively etched to form an Al metal mask on the glass substrate.

A glass substrate having the Al metal mask was provided on the support after the Al made support having a slope of 40° was installed in the Faraday cage according to Reference Example 1 above.

Then, the plasma etching was performed using ICP-RIE (Oxford's plasmaLab system 100) and $O_2$ and $C_4F_8$ were mixed as the reactive gas at a ratio of 5:45, and supplied at a flow rate of 50 sccm. Further, etching was performed with ICP power of 2 kW, and operating pressure of 7 to 10 mTorr for 3 minutes as etching conditions.

Example 2

The glass substrate was etched by the same method as Example 1 except that the bottom surface of the Faraday cage adopted not the SUS304 plate but a Cu plate.

Comparative Example 1

The glass substrate was etched by the same method as Example 1 except that the bottom surface of the Faraday cage adopted not the SUS304 plate but an Al plate.

Comparative Example 2

The glass substrate was etched by the same method as Example 1 except that the bottom surface of the Faraday cage adopted not the SUS304 plate but glass ($SiO_2$).

FIG. 5 illustrates an etching depth in a vertical direction for each position in inclination etching according to Examples 1 and 2 and Comparative Examples 1 and 2. A horizontal axis of FIG. 5 represents a distance from one side of the glass substrate positioned close to the mesh surface to the other side and a vertical axis represents a vertical depth etched for each position. In FIG. 5, in data of each of Examples 1 and 2 and Comparative Examples 1 and 2, a circle indicates a section where the needle-shaped structure is discovered. Further, in FIG. 5, the circle of each graph means a section where the needle-shaped structure is formed and means, for example, that the needle-shaped structure is generated in a section region of approximately 5 mm to 55 mm, which is an etching region in the case of Comparative Examples 1 and 2.

FIGS. 6A and 6B are SEM images of a glass substrate etched according to Example 1. Specifically, FIG. 6A is an image of an etching portion photographed at a distance of approximately 55 mm from one side of the glass substrate located close to the mesh surface and FIG. 6B is an image of the etching portion photographed at a distance of approximately 45 mm from one side of the glass substrate located close to the mesh surface. Reference numerals in FIGS. 6A and 6B represent the same positions as reference numerals depending on the position in FIG. 5.

FIGS. 7A to 7D are SEM images of an etching portion of a glass substrate etched according to Example 2. Specifically, FIG. 7A is an image of an etching portion photographed at a distance of approximately 5 mm from one side of the glass substrate located close to the mesh surface, FIG. 7B is an image of the etching portion photographed at a distance of approximately 20 mm from one side of the glass substrate located close to the mesh surface, FIG. 7C is an image of an etching portion photographed at a distance of approximately 25 mm from one side of the glass substrate located close to the mesh surface, and FIG. 7D is an image of the etching portion photographed at a distance of approximately 55 mm from one side of the glass substrate located close to the mesh surface. Reference numerals in FIGS. 7A to 7D represent the same positions as reference numerals depending on the position in FIG. 5.

FIGS. 8A to 8C are SEM images of an etching portion of a glass substrate etched according to Comparative Example 1. Specifically, FIG. 8A is an image of an etching portion photographed at a distance of approximately 10 mm from one side of the glass substrate located close to the mesh surface, FIG. 8B is an image of the etching portion photographed at a distance of approximately 40 mm from one side of the glass substrate located close to the mesh surface, and FIG. 8C is an image of the etching portion photographed at a distance of approximately 40 mm from one side of the glass substrate located close to the mesh surface. Reference numerals in FIGS. 8a to 8c represent the same positions as reference numerals depending on the position in FIG. 5.

FIGS. 9A and 9B are SEM images of an etched etching portion of a glass substrate according to Comparative Example 2. Specifically, FIG. 9A is an image of an etching portion photographed at a distance of approximately 15 mm from one side of the glass substrate located close to the mesh surface and FIG. 9B is an image of the etching portion photographed at a distance of approximately 45 mm from one side of the glass substrate located close to the mesh surface. Reference numerals in FIGS. 9A and 9B represent the same positions as reference numerals depending on the position in FIG. 5.

Furthermore, FIG. 10 is a graph illustrating conversion of data according to FIG. 5 into an etch rate at which a needle-shaped structure is generated and a section at which the needle-shaped structure is generated. Specifically, the horizontal axis of FIG. 10 represents the etch rate converted by dividing the etched vertical depth of FIG. 5 by an etching time of 3 minutes, and the vertical axis represents the section where the needle-shaped structure is generated in the glass substrate.

Referring to FIGS. 5 to 10 above, it can be seen that a range of the etch rate at which the needle-shaped structure appears at the time of the inclination etching according to Examples 1 and 2 is significantly narrower and the section where the needle-shaped structure is generated may be greatly reduced as compared with Comparative Examples 1 and 2.

Comparative Example 3

The glass substrate was etched in the same method as Example 1 except that the material of the support was changed to a Teflon polymer.

Example 3

The glass substrate was etched in the same method as Example 1 except that the material of the support was changed to Cu.

Example 4

The glass substrate was etched in the same method as Example 1 except that the material of the support was changed to Cu and the bottom surface of the Faraday cage adopted the Cu plate.

FIG. 11 is a graph illustrating conversion of an etching depth in a vertical direction for each position during inclined etching according to Example 1, Examples 3 and 4, and Comparative Example 3 into the etch rate at which the needle-shaped structure is generated and the section in which the needle-shaped structure is generated. Specifically, the horizontal axis of FIG. 11 represents the etch rate converted by dividing the etched vertical depth for each region by an etching time of 3 minutes, and the vertical axis represents the section where the needle-shaped structure is generated in the glass substrate.

FIGS. 12A to 12C are SEM images of an etched etching portion of a glass substrate according to Comparative Example 3. Specifically, FIG. 12A is an image of the etching portion photographed at an etch rate of approximately 45 nm/min, FIG. 12B is an image of the etching portion photographed at an etch rate of approximately 60 nm/min, and FIG. 12C is an image of the etching portion photographed at an etch rate of approximately 80 nm/min. Reference numerals in FIGS. 12A to 12C represent the same positions as reference numerals depending on the etch rate in FIG. 11.

FIGS. 13A and 13B are SEM images of an etched portion of a glass substrate according to Example 3. Specifically, FIG. 13A is an image of the etching portion photographed at an etch rate of approximately 60 nm/min and FIG. 13B is an image of the etching portion photographed at an etch rate of approximately 100 nm/min. Reference numerals in FIGS. 13A and 13B represent the same positions as reference numerals depending on the etch rate in FIG. 11.

FIGS. 14A to 14D are SEM images of an etched etching portion of a glass substrate according to Example 4. Specifically, FIG. 14A is an SEM image of the etching portion photographed at an etch rate of approximately 30 nm/min, FIG. 14B is an image of the etching portion photographed at an etch rate of approximately 60 nm/min, FIG. 14C is an image of the etching portion photographed at an etch rate of approximately 70 nm/min, and FIG. 14D is an image of the etching portion photographed at an etch rate of approximately 110 nm/min. Reference numerals in FIGS. 14A to 14D represent the same positions as reference numerals depending on the etch rate in FIG. 11.

Specifically, according to FIGS. 11 to 14D, in the case of Comparative Example 3 in which the material of the support is not metal but a polymer, it can be seen that the section where the needle-shaped structure is generated is widely distributed and the range of the etch rate in which the needle-shaped structure appears is also widely distributed. Contrary to this, when a support made of metal having a standard reduction potential equal to or higher than the metal mask is used, it can be seen that the ranges of the section and the etch rate in which the needle-shaped structure is generated are remarkably reduced compared with the comparative example. In particular, as in Example 4, when the support and the bottom surface of the Faraday cage adopted the Cu material having the higher standard reduction potential of the metal mask material, the appearance of the needle-shaped structure may be significantly suppressed.

The invention claimed is:

1. A plasma etching method using a Faraday cage, comprising:
   providing a Faraday cage having a mesh portion on an upper surface thereof in a plasma etching apparatus;
   providing a quartz substrate having a metal mask with an opening provided on one surface of the metal mask in the Faraday cage; and
   patterning the quartz substrate with plasma etching,
   wherein a bottom surface of the Faraday cage includes a metal having a lower ionization tendency than the metal mask, and
   wherein the mesh portion has a sheet resistance of $0.5\Omega/\square$ or more.

2. The plasma etching method of claim 1, wherein the metal of the bottom surface of the Faraday cage includes a metal whose standard reduction potential is higher than a standard reduction potential of the metal mask by 1 V or more.

3. The plasma etching method of claim 1, wherein the patterning includes adjusting an output of the plasma etching apparatus to 0.75 kW to 4 kW.

4. The plasma etching method of claim 1, wherein the patterning includes supplying a mixed gas containing a reactive gas and oxygen gas to the plasma etching apparatus at a flow rate of 10 sccm to 75 sccm.

5. The plasma etching method of claim 4, wherein a flow rate of the oxygen gas is 1% to 20% of a total flow rate of the mixed gas.

6. The plasma etching method of claim 1, wherein the metal mask includes at least one of aluminum and chromium and the bottom surface of the Faraday cage includes copper.

7. The plasma etching method of claim 1, wherein the mesh portion comprises carbon fluoride radicals adsorbed on a metal mesh.

8. The plasma etching method of claim 1, further comprising:

verifying a high-etched region in the Faraday cage by providing a sample substrate on the bottom surface of the Faraday cage and performing plane plasma etching of the sample substrate; and preparing an inclined support having an inclined surface and locating a lower region of the inclined surface at the high-etched region of the Faraday cage, wherein the quartz substrate is provided on the inclined surface of the inclined support.

9. The plasma etching method of claim 8, wherein, during patterning, an etching rate in a first area decreases from an upper region to a lower region of the inclined surface and the etching rate in a second area is inverted and increased.

10. The plasma etching method of claim 9, wherein the first inclined pattern portion is formed in the first region or the second region.

11. The plasma etching method of claim 8, wherein, during patterning, a first inclined pattern portion is formed at a first side of the quartz substrate and a second inclined pattern portion is formed at a second side of the quartz substrate at the same time,
    wherein the first inclined pattern portion includes a first inclined groove pattern having a first depth gradient, and
    wherein the second inclined pattern portion includes a second inclined groove pattern having a second depth gradient of 0 nm to 50 nm.

12. The plasma etching method of claim 8, wherein a difference between an upper etch rate at an uppermost portion of the inclined surface and a lower etch rate at a lowermost portion of the inclined surface is 30% or less.

13. The plasma etching method of claim 8, wherein the inclined support includes a metal having a standard reduction potential equal to or more than the standard reduction potential of the metal mask.

14. The plasma etching method of claim 1, wherein a height of a needle-shaped structure in the bottom surface of the etching portion of the patterned quartz substrate is 50 nm or less.

15. The plasma etching method of claim 1, wherein the patterned quartz substrate is a mold substrate for a diffraction grating light guide plate.

16. The plasma etching method of claim 1, wherein the mesh portion has a sheet resistance of $100\Omega/\square$ or less.

* * * * *